United States Patent [19]

Matsuo et al.

[11] Patent Number: 5,098,675

[45] Date of Patent: Mar. 24, 1992

[54] SILICON SINGLE CRYSTAL PULL-UP APPARATUS

[75] Inventors: Shuitsu Matsuo, Nishi-Okitama; Kazuo Ito, Hatano; Masayuki Saito; Yoshihisa Wada, both of Nishi-Okitama; Yukifumi Sakai, Hatano, all of Japan

[73] Assignee: Toshiba Ceramics Co., Ltd., Tokyo, Japan

[21] Appl. No.: 464,957

[22] Filed: Jan. 16, 1990

Related U.S. Application Data

[63] Continuation-in-part of Ser. No. 136,672, Dec. 22, 1987, abandoned.

[30] Foreign Application Priority Data

Dec. 26, 1986 [JP] Japan .................. 61-315577
Dec. 26, 1986 [JP] Japan .................. 61-315598
Dec. 26, 1986 [JP] Japan .................. 61-315599

[51] Int. Cl.$^5$ ............... C30B 15/02; C30B 15/30
[52] U.S. Cl. ..................... 422/249; 156/618.1; 156/619.1; 156/620.4; 156/DIG. 64
[58] Field of Search ......... 422/249; 156/618.1, 156/619.2, 620.4, DIG. 64

[56] References Cited

U.S. PATENT DOCUMENTS

| | | | |
|---|---|---|---|
| 2,822,308 | 2/1958 | Hall | 422/249 |
| 3,173,765 | 3/1965 | Gobat et al. | 422/249 |
| 3,261,671 | 7/1966 | DeJonge et al. | 422/249 |
| 3,495,630 | 2/1970 | Hansen et al. | 138/149 |
| 3,551,115 | 12/1970 | Jamieson et al. | 422/249 |
| 3,632,385 | 1/1972 | Schmidtt et al. | 117/46 |
| 3,953,281 | 4/1976 | Pantusco et al. | 156/DIG. 93 |
| 3,980,105 | 9/1976 | Myskowski | 138/140 |
| 4,134,785 | 1/1979 | Lavigna et al. | 422/249 |
| 4,235,848 | 11/1980 | Sokolov et al. | 422/249 |
| 4,378,269 | 3/1983 | Matsushita et al. | 156/DIG. 73 |
| 4,536,448 | 8/1985 | Ogawa et al. | 427/394 |
| 4,686,091 | 8/1987 | Washizuka et al. | 422/249 |
| 4,734,267 | 3/1988 | Kojima | 422/249 |

FOREIGN PATENT DOCUMENTS

| | | |
|---|---|---|
| 0177132 | 4/1986 | European Pat. Off. . |
| 3036178 | 9/1980 | Fed. Rep. of Germany . |
| 3441707 | 11/1984 | Fed. Rep. of Germany . |
| 2827113 | 8/1987 | Fed. Rep. of Germany . |
| 59-102880 | 7/1984 | Japan . |
| 61-63592 | 4/1986 | Japan . |
| 61-256993 | 11/1986 | Japan .................. 422/249 |

OTHER PUBLICATIONS

K. U. Ravi, "The Growth of EFG Silicon Ribbons", Journal of Crystal Growth, vol. 39, pp. 1–16 (1977).

*Primary Examiner*—Robert Kunemund
*Attorney, Agent, or Firm*—David G. Conlin; Ernest V. Linek

[57] ABSTRACT

A silicon single crystal pull-up apparatus includes a crucible for containing a molten silicon material, an annular heater disposed so as to surround the crucible for heating the silicon material in the crucible, and a plurality of plate-like members made of heat insulation material and disposed so as to surround the heater, each of the plate-like members has an arc-shaped cross section not less than a two-third circle and is connected with each other at respective side edges thereof such that the plurality of the plate-like members are assembled into a shape of a cylinder having wave-like circumferential side walls.

12 Claims, 6 Drawing Sheets

SILICON SINGLE CRYSTAL PULL-UP APPARATUS

CROSS-REFERENCE TO RELATED APPLICATION

The present application is a continuation-in-part of application Ser. No. 136,672 filed on Dec. 22, 1987, now abandoned.

BACKGROUND OF THE INVENTION

1. Field of the Invention

This invention relates to a heat insulation cylinder for use in a silicon single crystal pull-up apparatus, a silicon single crystal pull-up apparatus using such a heat insulation cylinder, heat insulation material used for the above-mentioned heat insulation cylinder, as well as a process for producing such material.

2. Description of The Related Art

Silicon single crystals used as substrates for semiconducter devices have been mainly prepared by Czochralski (CZ) method. In the CZ method, an ingot of single crystal is prepared, in principle, by rotatably supporting a crucible in a chamber, charging a silicon material in the crucible, melting the silicon material in the crucible by a carbon heater disposed at the outer circumference of the crucible, dipping a seed crystal rotatably suspended from above the molten silicon liquid to the surface of the molten silicon liquid and then pulling up the same.

Conventional heat insulation cylinders prepared by winding felt-like woven cloth made of carbon fibers in a plurality of layers to the outer circumference of a carbonaceous cylindrical plate is disposed around the outer circumference of the carbon heater. The heat insulation material used for the heat insulation cylinder has a porosity of about 85%, an intrinsic specific gravity of about 1.70 and a bulk specific gravity of about 0.4.

However, in the case of using the heat insulation cylinder molded by cylindrically winding the woven cloth of carbon fivers, since the effect of preserving the heat generated from the heater is low, the heater output has to be increased. Further, carbon fibers are oxidized and degraded thereby liable to be detached during long time use thus bringing about contamination by the intrusion of carbon powder into the crucible, causing shrinkage of the woven cloth and reducing the effect of insulating heat transmitted to the chamber. Accordingly, a great amount of flow rate is required as the cooling water for the chamber. This leads to a particularly serious problem under the present situation where the diameter of the crucible increases along with the increase in the diameter of the silicon single crystal ingot and the output of the heater has to increase in order to melt the silicon material.

Further, no sufficient heat insulation effect can be obtained with the heat insulation material having the porosity, the intrinsic specific gravity and the bulk specific gravity as described above.

By the way, a crucible made of quartz glass is practically used as the crucible. The quartz crucible reacts with the molten silicon liquid to generate SiO gas as shown below:

$SiO_2 + Si \rightarrow 2SiO$

The SiO gas reacts with carbon heated to the highest temperature to generate CO gas as shown below:

$SiO + 2C \rightarrow SiC + CO$

As a result, the working life of the carbon heater was shortened. Further, since CO gas is intaken into the molten silicon liquid, the carbon concentration in the ingot of the silicon single crystal increases and the crystal defects due to the increasing of carbon concentration increase.

SUMMARY OF THE INVENTION

The first object of this invention is to provide a heat insulation cylinder for use in a silicon single pull-up apparatus having high heat insulating effect and giving no undesired effects on the physical property of the silicon single crystal.

The second object of this invention is to provide a silicon single crystal pull-up apparatus having high heat insulating effect and giving no undesired effects on the physical property of the silicon single crystal.

The third object of this invention is to provide a heat insulation material of high heat insulating effect used for the heat insulation cylinder for use in a silicon single crystal pull-up apparatus.

The fourth object of this invention is to provide a process of producing a heat insulation material of high heat insulating effect used in the heat insulation cylinder for use in a silicon single crystal pull-up apparatus.

The first object of this invention can be obtained by:

a heat insulation cylinder for use in a silicon single crystal pull-up apparatus, comprising a plurality of plate-like members made of heat insulation material, each of the plate-like members having an arc-shaped cross section not less than a two-third circle and connected with each other at respective side edges thereof such that the plurality of the plate-like members are assembled into a shape of a cylinder having wave-like circumferential side walls, and by:

a heat insulation cylinder for use in a silicon single crystal pull-up apparatus, comprising two of cylindrical members arranged concentrically at a predetermined interval therebetween and made of heat insulation material, a plurality of rod-like members respectively made of heat insulation material, disposed in the predetermined interval at a predetermined distance and contacting with at least one of the two of the cylindrical members, and a plurality of tubular members respectively made of heat insulation material, disposed in the predetermined interval and between two of the rod-like members, and contacting with at least one of the two of the cylindrical members, two adjacent tubular members contacting with each other, each of two tubular members adjacent the rod-like member contacting the rod-like member, a diameter of the tubular member being not more than that of the rod-like member and not less than a two-third of that of the rod-like member.

According to the heat insulation cylinders of this invention, it is possible to provide a heat insulation cylinder for use in a silicon single crystal pull-up apparatus having high heat insulating effect and giving no undesired effects of the physical property of the silicon single crystal.

In accordance with the first heat insulation cylinder of this invention, since each of the plate-like members has an arc-shaped cross section not less than a two-third circle and connected with each other at respective side edges, each of the plate-like members can be sufficiently engaged with each other, no gap which a heated air passes through the plate-like members to an outside from an inside of the plate-like members assembled into a cylindrical shape is able to be formed between the plate-like members and high adiabatic efficiency can be obtained. Further, a heat insulation cylinder having a large diameter can be easily formed by means of increasing the number of the used plate-like members and exchanging the rails for retaining the plate-like members.

Furthermore, in accordace with the second heat insulation cylinder of this invention, since two of cylindrical members arranged concentrically at a predetermined interval therebetween, a plurality of rod-like respectively disposed in the predetermined interval at a predetermined distance and contacting with at least one of the two of the cylindrical members, and a plurality of tubular members respectively disposed in the predetermined interval and between two of the rod-like members, and contacting with at least one of the two of the cylindrical members, two adjacent tubular members contacting with each other, each of two tubular members adjacent the rod-like member contacting the rod-like member, the heat insulatin cylinder which is able to prevent heat convection from the inside cylindrical member to the outside cylindrical member can be easily assembled and the another heat insulation cylinder having a large diameter can be easily formed by means of increasing the number of the used tubular members and exchanging the cylindrical members.

The heat insulation material for the heat insulation cylinder according to this invention is preferably made of quartz glass, alumina, silicon carbide, carbon or graphite.

Ceramic fibers may be filled into the hollow portion of the tubular member or the hollow portion of the tubular member may be maintained at a vacuum pressure in order to make the heat insulating property preferable. Alternatively, the intended effect can be obtained only when one end of the tubular member is closed.

In a case where the heat insulation material is made of the composite carbon, since the composite carbon material has a high mechanical strength, it is possible to constitute the heat insulation cylinder per se at reduced thickness and reduced weight.

The second object of this invention can be obtained by:

a silicon single crystal pull-up apparatus comprising, a crucible for containing a molten silicon material, an annular heater disposed so as to surround said crucible for heating said silicon material in said crucible, and a plurality of plate-like members made of heat insulation material and disposed so as to surround said heater, each of the plate-like members having an arc-shaped cross section not less than a two-third circle and connected with each other at respective side edges thereof such that the plurality of the plate-like members are assembled into a shape of a cylinder having wave-like circumferential side walls, and by:

a silicon single crystal pull-up apparatus comprising, a crucible for containing a molten silicon material, an annular heater disposed so as to surround said crucible for heating said silicon material in said crucible, two of cylindrical members arranged concentrically at a predetermined interval therebtween so as to surround the heater and made of heat insulation material, a plurality of rod-like members respectively made of heat insulation material, disposed in the predetermined interval at a predetermined distance and contacting with at least one of the two of the cylindrical members and a plurality of tubular members respectively made of a heat insulation material, disposed in the predetermined interval and between two of the rod-like members, and contacting with at least one of the two of the cylindrical members, two of adjacent tubular members contacting with each other, each of two tubular members adjacent the rod-like member contacting the rod-like member, a diameter of the tubular member being not more than that of the rod-like member and not less than a two-third of that of the rod-like member.

According to the respective apparatus of this invention, the heater is surrounded by the plurality of the plate-like members or two of cylindrical members including the plurality of the tubular members thereinside, it is possible to provide a silicon single crystal pull-up apparatus in which the temperature of the heater is preferably preserved while giving no undesired effects on the physical property of the silicon single crystal.

Further since the plurality of plate-like membrs or tubular members assembled into a cylindrical shape, the temperature of the heater can be preserved more preferably and, as a result, the heater output can be reduced. The material for the plate-like member and the tubular member may be identical with each other.

The third object of this invention can be obtained by a heat insulation material used for the heat insulation cylinder for use in a silicon single crystal pull-up apparatus having a porosity of from 50 to 99%, an intrinsic specific gravity of from 1.06 to 1.9 and a bulk specific gravity of from 0.02 to 0.6.

According to the heat insulation material of this invention, since the heat insulation material comprises a porous carbonaceous material, it is possible to provide a heat insulation material having high heat insulating effect, with no detachment of the heat insulation material itself and, accordingly, giving no undesired effects in the physical property of the silicon single crystal.

The fourth object of this invention can be obtained by a process of producing a heat insulation material used for a heat insulation cylinder for use in a silicon single crystal pull-up apparatus, comprising a step of impregnating an urethane foam with a liquid mixture of a resin and an acidic curing agent, a step of burning the impregnated urethane foam so as to carbonize the urethane foam and a step of exposing the burned urethan foam to a chlorine atmosphere at a temperature not less than 2000° C.

According to the process of this invention, it is possible to provide a process for producing a heat insulation material having high heat resistance and giving no undesired effects on the physical property of the silicon single crystal.

The resin used in the process according to this invention, thermosetting resin such as phenol resin is preferred. Further, hydrogen chloride is preferably used as the acidic curing agent in the process according to this invention.

The step of burning the urethane foam by the process according to this invention is preferably conducted at a temperature of not less than 800° C., particularly, not less than 1200° C.

In the process according to this invention, since the step of exposing the urethane foam into a chlorine atmosphere is carried out at a temperature not less than 2000° C., impurity which would give undesired effects on the physical property of the silicon single crystal can be removed, If the temperature at the exposing step is less than 2000° C., impurity is not sufficiently brought into reaction with the chlorine gas and the purity of carbon can not be improved. More preferably, the exposing step is conducted at a temperature from 2000° to 2500° C.

DETAILED DESCRIPTION OF THE PREFERRED EMBODIMENT

Figure 1:
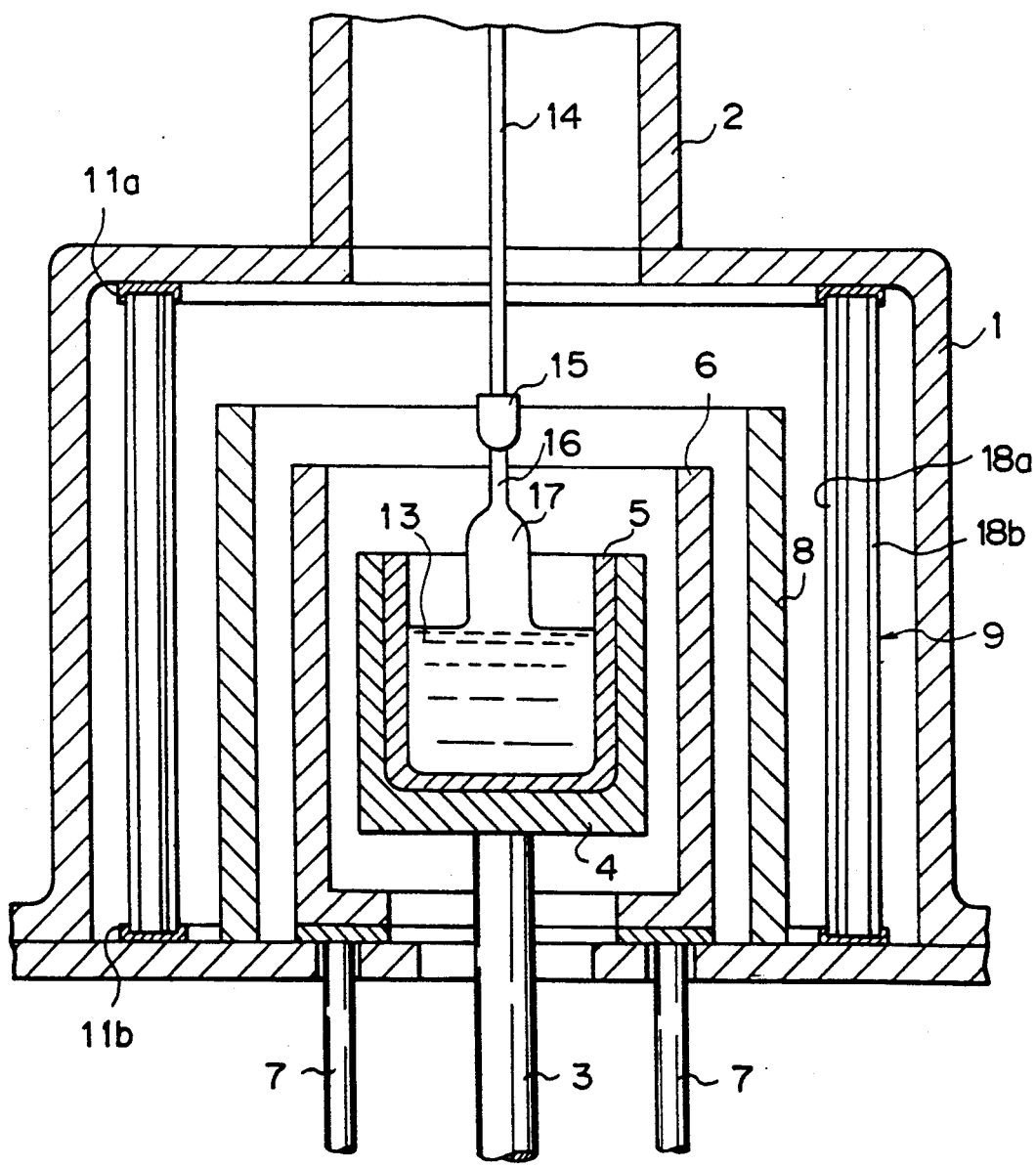
FIG. 1 is a fragmentary vertical cross sectional view for a silicon single crystal pull-up apparatus equipped with one embodiment of the heat insulation cylinder according to this invention.

Embodiments of the heat insulation cylinder and the apparatus according to this invention will be described below referring to the drawings.

Embodiments to be described below are mere means which will bring about a clear understanding of this invention and various changes and modifications thereof could be made by those skilled in the art without departing from the scope of this invention clearly defined in attached claims.

In FIG. 1, a pull chamber 2 is disposed on a chamber 1. A rotating shaft 3 is inserted from the lower opening of the chamber 1 and a crucible protection member 4 made of carbon is secured to the upper end of the rotating shaft 3 for protecting a crucible 5 made of quartz glass inside thereof. A cylindrical carbon heater 6 is disposed at the outer circumference of the protection member 4 and connected with electrodes 7, 7 inserted from below the chamber 1. A heat insulation cylinder 8 comprising a plurality of plate-like members assembled into a cylindrical shape is disposed at the outer circumference of the heater 6, and a temperature preserving cylinder, that is, a heat insulation cylinder 9 comprising a plurality of tubular members assembled into a cylindrical shape in the same manner is disposed further to the outer circumference thereof.

Figure 2:
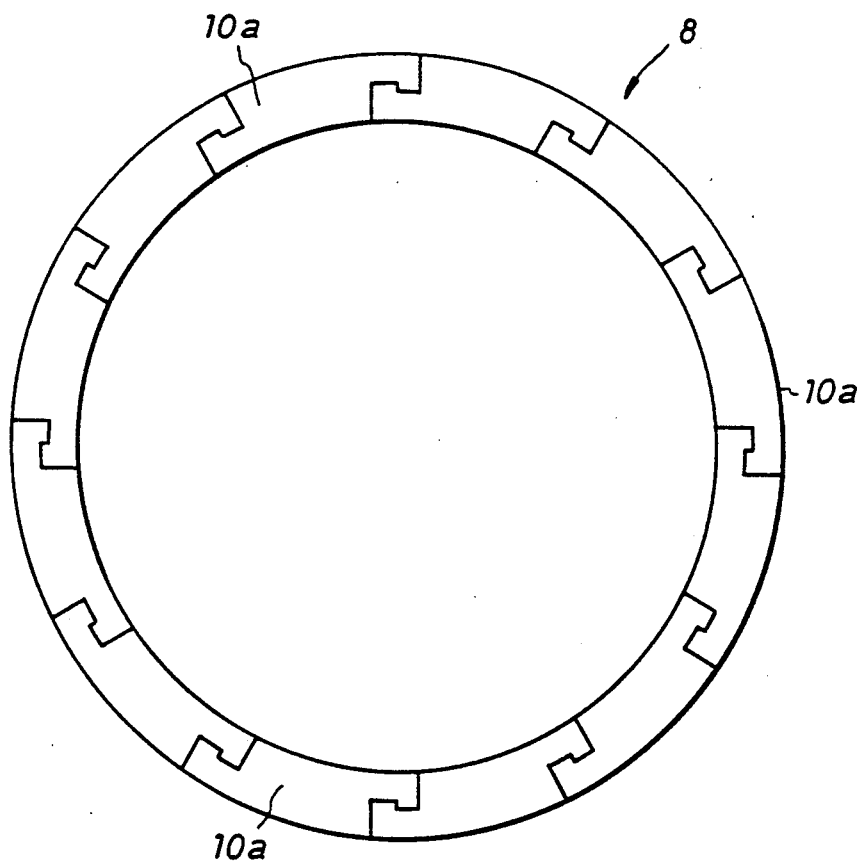
FIG. 2 is a transversal cross sectional view for the heat insulation cylinder.

As shown in FIG. 2, each of the plate-like members 10a made of carbon constituting the heat insulation cylinder 8 has a complimentary protrusion and a recess formed on both ends thereof so that adjacent members are fitted to each other. The plate-like members 10a can be assembled with ease when they are secured at the upper and the lower ends thereof with annular rail-like rings although not illustrated in the drawing.

Figure 4:
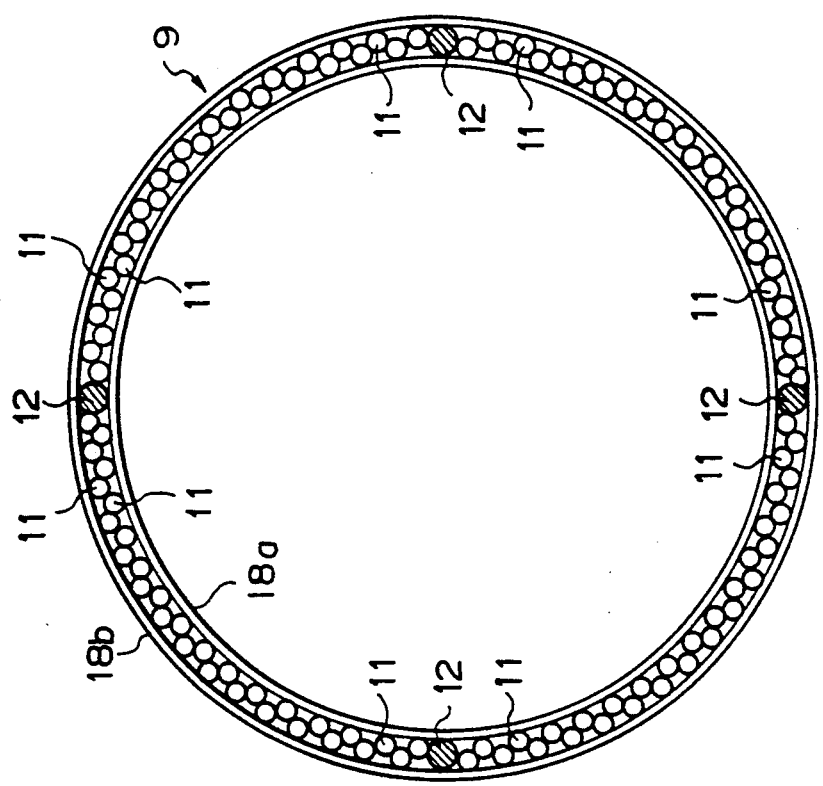
FIG. 4 is a transversal cross sectional view of another embodiment for the heat insulation cylinder according to this invention.
Figure 3:
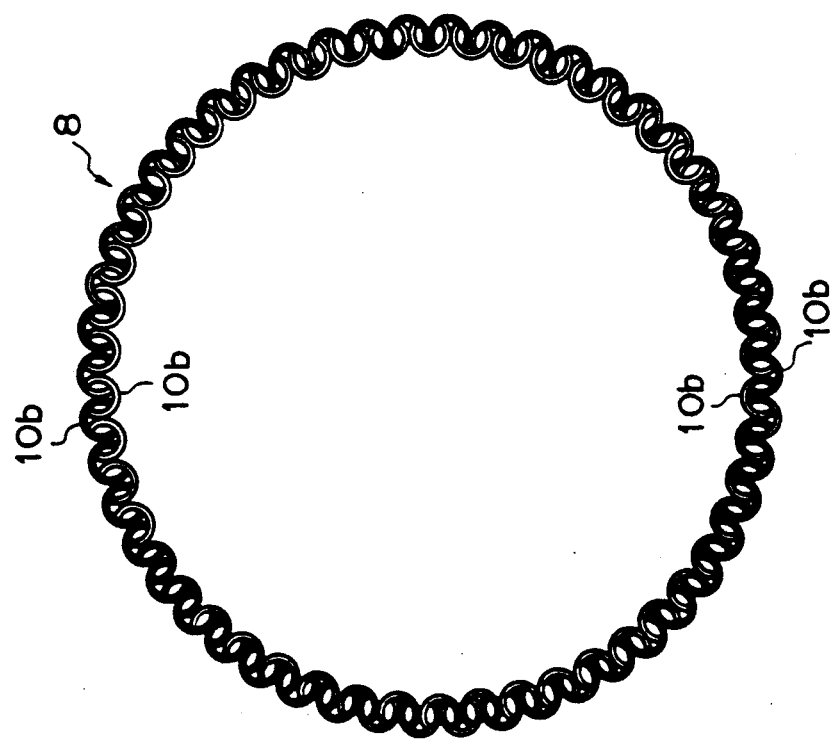
FIG. 3 is a transversal cross sectional view of one embodiment for the heat insulation cylinder according to this invention.

The one embodiment of the heat insulation cylinder 8 is shown in FIG. 3. It may comprise, as shown in FIG. 3, a plurality of plate-like members 10b each have an arc-shaped cross section not less than a two-third circle made of silicon carbide and are assembled alternately into a shape of a cylinder having wave-like circumferential side walls. Further, the heat insulation cylinder 9 is disposed, as shown in FIG. 4, by assembling a plurality of tubes 11 made of quartz glass between an upper annular rail 11a and a lower annular rail 11b made of carbon and disposing four rod-like members 12 at an appropriate distance to secure the rails 11a and 11b for retaining the tubes 11. The rod-like members can be fixed on at least one of the two of the cylindrical members 18a, 18b.

The heat insulation cylinder 9 may be of the same structure and material as those of the heat insulation cylinder 8.

The tubular members 11 contacting with at least one of the two of the cylindrical member 18a, 18b and two adjacent tubular members 11 contact with each other. Each of the tubular members 11 adjacent the rod-like member 12 contacts the rod-like member. Further, a diameter of the tubular member 11 is not more than that of the rod-like member 12 and not less than a two-third of that of the the rod-like member 12.

An ingot of silicon single crystal is pulled-up as described below by using the apparatus. That is, after charging polycrystalline silicon material into the crucible 5, electric current is supplied to the heater 6 thereby melting the silicon material in the crucible 5. Then, a seed crystal 16 attached to a seed chuck 15 to the lower end of a pull-up shaft 14 suspended from above the pull chamber 2 is immersed to the molten silicon liquid 13 and then pulled up to thereby pull-up the ingot 17 of the silicon single crystal.

Explanation will be made for the preferred embodiment of the heat insulation material and the production process therefor according to this invention.

At first, a phenol resin incorporated with 3% of hydrogen chloride as an acidic curing agent is impregnated into a cylindrical urethane foam in the shape of 600 mm inner diameter×700 mm diameter×550 mm height, and the urethane foam is cured, and then burned at 1200° C. for 3 hours so that the urethane foam is carbonized. Further, the thus burned urethane foam is applied with highly purifying treatment by the exposure to a chlorine atmosphere at 2000° C. 3 hours.

The thus obtained carbonaceous porous material has a porosity of 80%, an intrinsic specific gravity of 1.78, a bulk specific gravity of 0.45 and sufficiently high mechanical strength.

Then the heat insulating performance are examined for the resultant porous carbonaceous material (working example) and a woven cloth of carbon fibers wound into a cylindrical shape followed by molding (comparative example), while assuming the case that they are used as heat insulation cylinders for use in a silicon single crystal pull-up apparatus. As a result, the heat insulation cylinder of the working example shows comparable heat insulation performance with the conventional heat insulation cylinder and, since carbon fibers, etc. are not used, undesirable fiber defoliation or the like does not occur thereby eliminating the carbon pollution to single silicon crystal.

In a case where silicon single crystal are actually pulled up by using the resultant carbonaceous porous material for the heat insulation cylinder of the single silicon crystal pull-up apparatus, since there is no pollution cause by the partial detachment thereof, the yield of the silicon single crystal can be improved by 20%.

Figure 5:
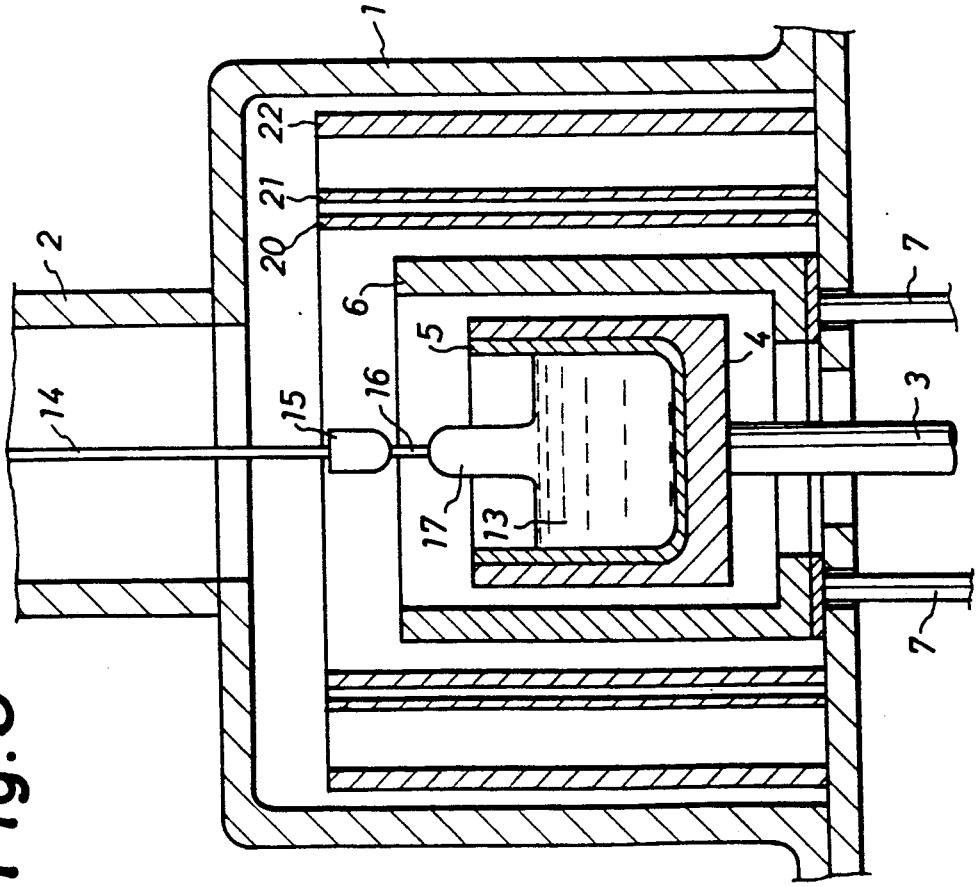
FIG. 5 is a fragmentary vertical cross sectional view for a silicon single crystal pull-up apparatus equipped with the insulation cylinder.

Explanation will then be made to FIG. 5. In FIG. 5, the same constitutional elements as those in the device of FIG. 1 carry the identical reference numerals, the explanations for which have been already made in FIG. 1.

In FIG. 5, heat insulation cylinders 20, 21, 22 made of composite carbon material in three layers are disposed at the outer circumference of a heater 6 for preserving heat from the heater 6. The heat insulation cylinders 20, 21, 22 are prepared by molding carbon fibers wound into a cylindrical shape, impregnating a phenol resin into the molded carbon fibers and then burinng the impregnated carbon fibers.

According to the apparatus as described above, since carbon does not detached from the heat insulation cylinders 20, 21, 22 increase of the carbon concentration in the ingot 17 can be prevented. Further, by disposing the heat insulation cylinders 20, 21, 22 by three layers, for example, as shown in FIGS. 5 and 6, temperature preserving and heat insulating effects can be improved to thereby save the heater power and decrease the flow rate of the cooling water.

Since the heat insulation cylinders are disposed by a plurality of layers, it is only necessary to replace the consumed insulation cylinder nearest to the heater, which is economically advantageous, as well as can increase the temperature preserving and heat insulating effects thereby saving the heater power and reducing the flow rate of the cooling water.

The heat insulation cylinders comprising a plurality of tubes or plate-like members assembled into a cylindrical shape may be used together, in addition to the heat insulation cylinder made of composite carbon member so long as they cause no carbon detachment.

Figure 6:
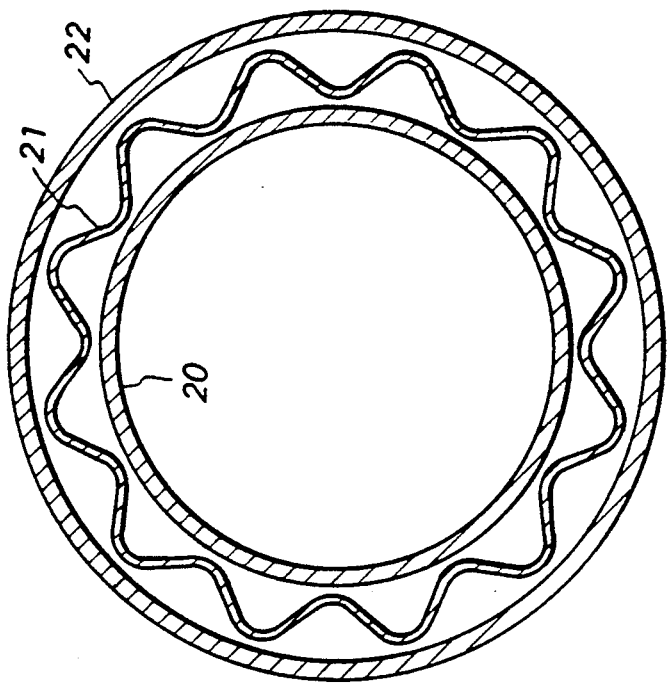
FIG. 6 is a transversal cross sectional view for the heat insulation cylinder.

Further, since a heat insulation cylinder 21 of a corrugated cross sectional shape and heat insulation cylinders 20, 22 are disposed in plurality in FIG. 6, longitudinal strength of the heat insulation cylinder shown in FIG. 6 can be increased and excellent temperature preserving effect can be obtained.

Figure 7:
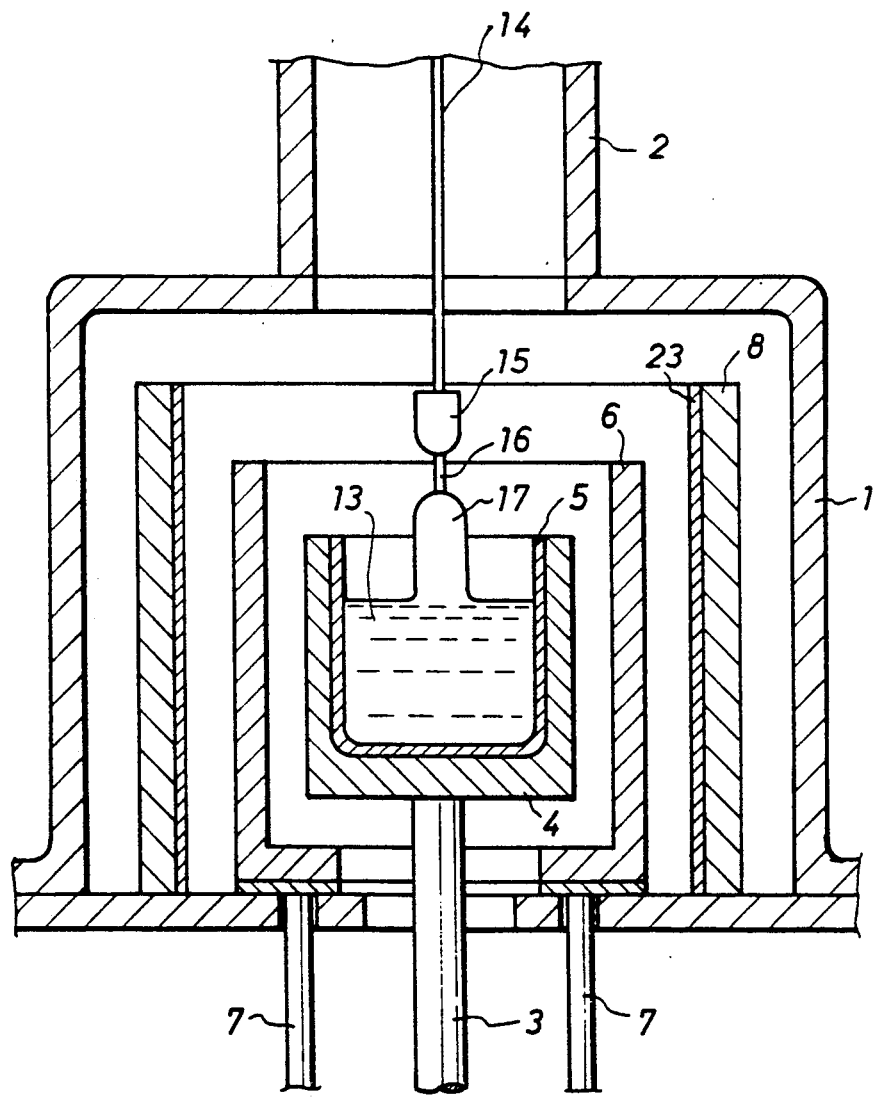
FIG. 7 is a fragmentary vertical cross sectional view for a silicon single crystal pull-up apparatus equipped with the insulation cylinder.

Explanation will be made to an apparatus referring to FIG. 7. In FIG. 7, the same constitutional elements as those of the apparatus shown in FIG. 1 carry the same reference numerals, for which the explanation has already been made referring to FIG. 1.

In the apparatus shown in FIG. 7, a heat insulation cylinder 8 is disposed at the outer circumference of the heater 6 and a cylindrical body 23 comprising a composite carbon material prepared by moulding carbon fibers wound into a cylindrical shape in brought into close contact with the inner circumference surface of the cylinder 8.

In the apparatus, cylinder body 23 disposed in close contact with the heat insulation cylinder 8 has a high mechanical strength per se and carbon fibers do not fall from the surface of the heat insulation cylinder 8. Then, since the cylinder body 23 prevents the small fractions of the carbon fibers from falling from the surface of the heat insulation cylinder 8, the fractions of the carbon fibers do not fall into the molten silicon liquid. Moreover, the cylinder body 23 is thin and can be purified with ease to obtain a high purity. Accordingly, the carbon concentration in the ingot 17 can be lowered to decrease the crystal defects.

Figure 8:
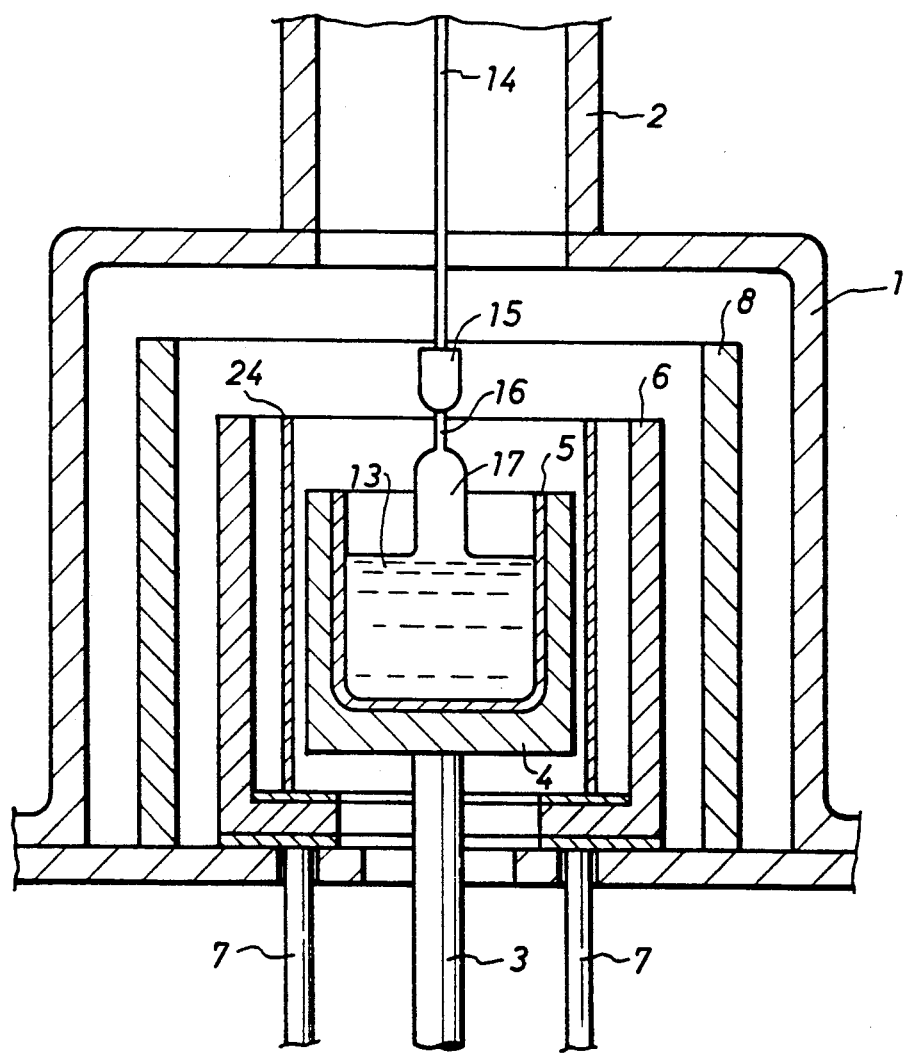
FIG. 8 is a fragmentary vertical cross sectional view for a silicon single crystal pull-up apparatus equipped with a gas shielding filter.

Explanation will be made to an apparatus equipped with a gas shielding filter while referring to FIG. 8. In FIG. 8, the same constitutional elements as those of the apparatus shown in FIG. 1 carry the same reference numerals, for which the explanations have already been made referring to FIG. 1.

In FIG. 8, a thin cylindrical gas shielding cylinder 24 composed of composite carbon member having the wound carbon fibers is disposed between a protection body 4 and a carbon heater 6. The gas shielding cylinder 24 is prepared by cylindrically shaping the wound carbon fibers, impregnating the thus shaped carbon fibers with a phenol resin, curing the thus impregnating carbon fibers by heat treatment and further burning the thus-treated carbon fibers. The thickness of the gas shielding cylinder 24 is 3 mm. A heat insulation cylinder 8 is disposed at the outer circumference of the heater 6.

The heat insulation cylinder of the apparatus shown in FIG. 8 includes the modified embodiments as described below.

A heat insulation cylinder 8 may comprise a plurality of plate-like members connected with each other at side edges thereof and assembled into a cylindrical shape.

A heat insulation cylinder 8 may comprise a plurality of tubular members contacting with each other at circumferential sides thereof and assembled into a cylindrical shape.

A heat insulation cylinder 8 may comprise a composite carbon member prepared by moulding carbon fibers wound into a cylindrical shape.

A heat insulation cylinder 8 may comprise a cylindrical member in which carbon fibers are wound cylindrically in a multi-layer and a cylindrical composite carbon material made of wound carbon fibers close contacting with at least an inner circumferential surface of the cylindrical member.

For the structure and the material of the heat insulation cylinder 8, those technics disclosed in other portions of the present specification can be selected.

In the above-mentioned apparatus, since the gas shielding cylinder 24 comprising the composite carbon material prepared by moulding wound carbon fibers is brought into reaction with the SiO gas evolved upon reaction between the crucible 5 made of quartz glass and the molten silicon liquid 13, it is possible to prevent the reaction between the SiO gas and the carbon heater 6 thereby increasing the working life of the heater 6. Since the gas shielding cylinder 24 is a thin carbon composite body, it can be purified with ease and has high purity, it is advantageous for decreasing the crystal defects in the silicon single crystal. Then, since the gas shielding cylinder 24 can be produced at much lower cost as compared with the heater 6 and does not increase the cost even upon frequent replacement, a satisfactory silicon single crystal can always be pulled-up desirably.

What is claimed is:

1. A heat insulation cylinder for use in a silicon single crystal pull-up apparatus comprising:

a plurality of plate-like members made of heat insulation material, each of said plate-like members having an arc-shaped cross section not less than a two-third circle and connected with each other at respective side edges thereof such that the plurality of said plate-like members are assembled into a shape of a cylinder having wave-like circumferential side walls.

2. The cylinder according to claim 1, in which said heat insulation material is made of one material selected from the group consisting of quartz glass, alumina, silicon carbide, carbon and graphite.

3. A silicon single crystal pull-up apparatus comprising:
   a crucible for containing a molten silicon material;
   an annular heater disposed so as to surround said crucible for heating said silicon material in said crucible; and
   a plurality of plate-like members made of heat insulation material and disposed so as to surround said heater, each of said plate-like members having an arc-shaped cross section not less than a two-third circle and connected with each other at respective side edges thereof such that the plurality of said plate-like members are assembled into a shape of a cylinder having wave-like circumferential side walls.

4. The apparatus according to claim 3, in which said heat insulation material is made of one material selected from the group consisting of quartz glass, alumina, silicon carbide, carbon and graphite.

5. A heat insulation cylinder for use in a silicon single crystal pull-up apparatus comprising:
   two of cylindrical members made of heat insulation material and arranged concentrically at a predetermined interval therebetween;
   a plurality of rob-like members respectively made of heat insulation material, disposed between the two of said cylindrical members at a predetermined distance and being in contact with at least one of the two of said cylindrical members; and pl a plurality of tubular members respectively made of heat insulation material, retained between the two of said cylindrical members and in contact with at least one of the two of said cylindrical members, being in contact with each other;
   each of said rod-like members being in contact with the adjacent tubular members;
   a diameter of said tubular member being not more than that of said rod-like member and not less than a two-third of that of said rod-like member.

6. The cylinder according to claim 5, in which each of said rob-like members is fixed on at least one of the two of said cylindrical members.

7. The cylinder according to claim 5 or 6, in which ceramic fibers are filled into hollow portions among said tubular members.

8. The cylinder according to claim 5 or 6, in which said heat insulation material is selected from the group consisting of quartz glass, aluminum, silicon carbide, carbon and graphite.

9. A silicon single crystal pull-up apparatus comprising:
   a crucible for containing a molten silicon material;
   an annular heater disposed so as to surround said crucible for heating said silicon material in said crucible;
   two of cylindrical members made of heat insulation material and arranged concentrically at a predetermined interval therebetween so as to surround said annular heater;
   a plurality of rob-like members respectively made of heat insulation material, disposed between the two of predetermined distance and being in contact with at least one of the two of said cylindrical members; and
   a plurality of tubular members respectively made of heat insulation material, retained between the two of said cylindrical members and being in contact with at least one of said two cylindrical members, two adjacent tubular members being in contact with each other;
   each of two tubular members being in contact with the adjacent tubular members;
   a diameter of said tubular member being not more than that of said rod-like member and not less than a two-third of that of said rod-like member.

10. The apparatus according to claim 9, in which each of said rod-like members is fixed at at least one of the two of said cylindrical members.

11. The apparatus according to claim 9 or 10, in which ceramic fibers are filled into hollow portions of said tubular members.

12. The apparatus according to claim 9 or 10, in which said heat insulation material is made of one material selected from the group consisting of quartz glass, alumina, silicon carbide, carbon and graphite.

* * * * *